(12) United States Patent
Wang

(10) Patent No.: US 11,394,013 B2
(45) Date of Patent: Jul. 19, 2022

(54) DISPLAY PANEL WITH LIGHT-EMITTING LAYER, DISPLAY DEVICE AND MANUFACTURING METHOD OF DISPLAY PANEL

(71) Applicant: BOE TECHNOLOGY GROUP CO., LTD., Beijing (CN)

(72) Inventor: Tao Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 296 days.

(21) Appl. No.: 16/494,931

(22) PCT Filed: Feb. 18, 2019

(86) PCT No.: PCT/CN2019/075395
§ 371 (c)(1),
(2) Date: Sep. 17, 2019

(87) PCT Pub. No.: WO2019/227976
PCT Pub. Date: Dec. 5, 2019

(65) Prior Publication Data
US 2021/0399265 A1  Dec. 23, 2021

(30) Foreign Application Priority Data
Jun. 1, 2018  (CN) .......................... 201810557390.0

(51) Int. Cl.
*H01L 51/52* (2006.01)
*H01L 27/32* (2006.01)
*H01L 51/56* (2006.01)

(52) U.S. Cl.
CPC ...... *H01L 51/5281* (2013.01); *H01L 27/3246* (2013.01); *H01L 51/5284* (2013.01);
(Continued)

(58) Field of Classification Search
USPC ........................................................... 257/88
See application file for complete search history.

(56) References Cited

U.S. PATENT DOCUMENTS

| 8,517,787 B2 | 8/2013 | Kim |
| 2006/0066777 A1* | 3/2006 | Kim ...................... G02B 5/201 349/106 |

(Continued)

FOREIGN PATENT DOCUMENTS

| CN | 101051649 A | 10/2007 |
| CN | 101150141 A | 3/2008 |

(Continued)

OTHER PUBLICATIONS

International Search Report of PCT/CN2019/075395 in Chinese, dated May 20, 2019, with English translation.

*Primary Examiner* — Nduka E Ojeh
(74) *Attorney, Agent, or Firm* — Collard & Roe, P.C.

(57) ABSTRACT

A display panel with light-emitting layer, a display device and a manufacturing method of a display panel are provided. The display panel includes: a substrate, including a plurality of sub-pixel regions; a light-emitting layer, disposed in each of the sub-pixel regions; a light transmitting layer disposed on a surface of the light-emitting layer away from the substrate, and a surface of the light transmitting layer away from the light-emitting layer is a curved surface recessed towards the light-emitting layer.

16 Claims, 8 Drawing Sheets

(52) U.S. Cl.
CPC ............ *H01L 51/56* (2013.01); *H01L 27/322* (2013.01); *H01L 27/3211* (2013.01); *H01L 2227/323* (2013.01); *H01L 2251/5338* (2013.01)

(56) References Cited

U.S. PATENT DOCUMENTS

| | | | |
|---|---|---|---|
| 2006/0109397 A1 | 5/2006 | Anandan | |
| 2010/0327297 A1 | 12/2010 | Yoshida et al. | |
| 2011/0050657 A1* | 3/2011 | Yamada | H01L 51/5237 345/204 |
| 2014/0027724 A1* | 1/2014 | Lim | H01L 27/322 257/40 |
| 2018/0210280 A1* | 7/2018 | Chen | H01L 27/32 |
| 2018/0269268 A1* | 9/2018 | Cai | H01L 51/5203 |
| 2019/0165053 A1* | 5/2019 | Park | H01L 51/5256 |
| 2020/0264731 A1* | 8/2020 | Naganuma | G06F 3/0445 |

FOREIGN PATENT DOCUMENTS

| | | |
|---|---|---|
| CN | 105489631 A | 4/2016 |
| CN | 108735104 A | 11/2018 |

\* cited by examiner

DISPLAY PANEL WITH LIGHT-EMITTING LAYER, DISPLAY DEVICE AND MANUFACTURING METHOD OF DISPLAY PANEL

CROSS-REFERENCE TO RELATED APPLICATIONS

This application is the National Stage of PCT/CN2019/075395 filed on Feb. 18, 2019, which claims priority under 35 U.S.C. § 119 of Chinese Application No. 201810557390.0 filed on Jun. 1, 2018, the disclosure of which is incorporated by reference.

TECHNICAL FIELD

Embodiments of the present disclosure relate to a display panel, a display device and a manufacturing method of a display panel.

BACKGROUND

At present, a polarizer is required to be attached to display panel. The polarizer is composed of a plurality of films, and a thickness of the polarizer is relatively thick, which makes the display panel cannot be bent or folded at all parts.

SUMMARY

Embodiments of the present disclosure provide a display panel, a display device and a manufacturing method of a display panel.

According to a first aspect of the present disclosure, a display panel is provided, and the display panel comprises:

a substrate, comprising a plurality of sub-pixel regions;

a light-emitting layer, disposed in each of the plurality of sub-pixel regions;

a light transmitting layer, disposed on a surface of the light-emitting layer away from the substrate, a surface of the light transmitting layer away from the light-emitting layer being a curved surface recessed towards the light-emitting layer.

According to an embodiment of the present disclosure, the display panel further comprises a pixel definition layer, and the pixel definition layer is disposed on a surface of the substrate and defines the plurality of the sub-pixel regions which are spaced apart from each other, and the pixel definition layer is made of an opaque material.

According to an embodiment of the present disclosure, the light transmitting layer has a predetermined color, and the light-emitting layer located in a same sub-pixel region as the light transmitting layer has a color same as the predetermined color of the light transmitting layer.

According to an embodiment of the present disclosure, a material of the light transmitting layer comprises a photoresist.

According to an embodiment of the present disclosure, the photoresist comprises one or more selected from the group consisting of acrylate, epoxy, and polyurethane.

According to an embodiment of the present disclosure, a minimum distance between the curved surface of the light transmitting layer and the light-emitting layer is from 1 micron to 3.5 microns.

According to an embodiment of the present disclosure, the display panel further comprises a black matrix, and the black matrix is disposed on a surface of the pixel definition layer away from the substrate.

According to an embodiment of the present disclosure, a curvature radius R of the curved surface of the light transmitting layer satisfies: $R \leq 2a \times (n-1)/(b \times h)$, wherein an external incident light infinitely close to an center of the light transmitting layer is incident on an incident point of the substrate and then reflected by the substrate to form a reflect light, the reflect light coincides with a side of a cross section of the black matrix, wherein a is a distance between the incident point on the substrate and an edge of the pixel definition layer closest to the incident point, b is a spot diameter of the external incident light, n is a refractive index of the light transmitting layer, and h is a height of the pixel definition layer.

According to an embodiment of the present disclosure, parameters R, b, h, n, and a are set such that among lights incident on the substrate along a direction perpendicular to the substrate, except a part of lights incident on an center of the curved surface, remaining part of lights are reflected by the substrate and then enter at least one of the pixel definition layer and the black matrix.

According to an embodiment of the present disclosure, the display panel further comprises an encapsulating film, and the encapsulating film is disposed on both a surface of the pixel definition layer away from the substrate and a surface of the light-emitting layer away from the substrate, and the encapsulating film comprises at least a first inorganic layer and a first organic layer which are stacked; the first inorganic layer is disposed on both the surface of the pixel definition layer away from the base substrate and the surface of the light-emitting layer away from the base substrate, the first organic layer is disposed on a surface of the first inorganic layer away from the substrate, and the black matrix and the light transmitting layer together constitute the first organic layer.

According to an embodiment of the present disclosure, the encapsulating film further comprises a second inorganic layer, where the second inorganic layer overlays the first organic layer.

According to an embodiment of the present disclosure, the encapsulating film further comprises a second inorganic layer and a second organic layer, and the encapsulating film comprises the first inorganic layer, the first organic layer, the second inorganic layer, and the second organic layer which are stacked in sequence.

According to a second aspect of the present disclosure, a display device is provided, and the display device comprises any one of the display panels mentioned above.

According to a third aspect of the present disclosure, a manufacturing method of a display panel is provided, and the manufacturing method comprises:

providing a substrate, the substrate comprises a plurality of sub-pixel regions;

forming a light-emitting layer in each of the plurality of the sub-pixel regions; and forming a light transmitting layer on a surface of the light-emitting layer away from the substrate, a surface of the light transmitting layer away from the light-emitting layer being a curved surface recessed towards the light-emitting layer.

According to an embodiment of the present disclosure, the method further comprises forming a pixel definition layer on a surface of the substrate, wherein the pixel definition layer defines the plurality of the sub-pixel regions which are spaced apart from each other, and the pixel definition layer is made of an opaque material.

According to an embodiment of the present disclosure, before forming the light transmitting layer, the method further comprising: forming a black matrix on a surface of the pixel definition layer away from the substrate.

According to an embodiment of the present disclosure, before forming the black matrix, the method further comprising: forming a first inorganic layer on both the surface of the pixel definition layer away from the substrate and the surface of the light-emitting layer away from the substrate.

According to an embodiment of the present disclosure, the light-emitting layer is formed by a photolithography process or an ink-jet printing process.

BRIEF DESCRIPTION OF THE DRAWINGS

In order to clearly illustrate the technical solution of the embodiments of the present disclosure, the drawings of the embodiments will be briefly described. It is apparent that the described drawings are only related to some embodiments of the present disclosure and thus are not limitative of the present disclosure.

DETAILED DESCRIPTION

In order to make objects, technical details and advantages of embodiments of the disclosure clear, the technical solutions of the embodiments will be described in a clearly and fully understandable way in connection with the related drawings. It is apparent that the described embodiments are just a part but not all of the embodiments of the disclosure. Based on the described embodiments herein, those skilled in the art can obtain, without any inventive work, other embodiment(s) which should be within the scope of the disclosure.

Unless otherwise defined, all the technical and scientific terms used herein have the same meanings as commonly understood by one of ordinary skill in the art to which the present invention belongs. The terms "first," "second," etc., which are used in the description and claims of the present application, are not intended to indicate any sequence, amount or importance, but to distinguish various components. The terms "comprises," "comprising," "includes," "including," etc., are intended to specify that the elements or the objects stated before these terms encompass the elements or the objects listed after these terms as well as equivalents thereof, but do not exclude other elements or objects. The phrases "connect", "connected", etc., are not intended to define a physical connection or mechanical connection, but may include an electrical connection which is direct or indirect. The terms "on," "under," "right," "left" and the like are only used to indicate relative position relationship, and when the position of an object is described as being changed, the relative position relationship may be changed accordingly.

Figure 1:
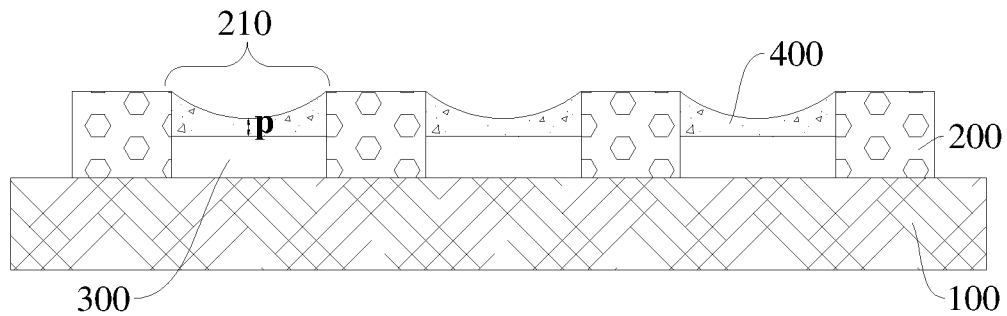
FIG. 1 is a schematic diagram of a section structure of a display panel in an embodiment of the present disclosure.

An embodiment of the present disclosure provides a display panel. According to the embodiment of the present disclosure, with reference to FIG. 1, the display panel comprises: a substrate 100, which has a plurality of sub-pixel regions 210; a light-emitting layer 300, the light-emitting layer 300 is disposed in each of the sub-pixel regions 210; a light transmitting layer 400, the light transmitting layer 400 is arranged on a surface of the light-emitting layer 300 away from the substrate 100. Herein, a surface of the light transmitting layer 400 away from the light-emitting layer 300 is a curved surface that is recessed towards the light-emitting layer 300. According to the embodiment of the present disclosure, the light transmitting layer 400 of the display panel is arranged have a concave surface, such that lights incident on the concave surface of the light transmitting layer 400 can be deflected into the display panel, and it is not possible to make the incident lights inside of the display panel reflected back to the outside of the display panel in a vertical direction. As a result, an anti-reflective performance within a front viewing angle of the display panel is increased. In addition, a polarizer in the existing display panel is replaced with the light transmitting layer having the concave surface to achieve thinning of the structure, so that the image which is displayed by the display panel has a better contrast.

In at least some embodiments, the surface of the light transmitting layer 400 of the display panel is arranged to be the curved surface, and at the same time, the curved surface is matched with a black matrix 500 and a pixel definition layer 200, in this way, the light incident on the light transmitting layer 400 can be absorbed directly by the black matrix 500 or the pixel definition layer 200 after being deflected inside the display panel. As a result, the anti-reflection performance of the display panel from a full viewing angle is increased. The light transmitting layer having the curved surface replaces the polarizer in the existing display panel to realize the thinning of a structure.

According to an embodiment of the present disclosure, a curvature radius of the curved surface of the light transmitting layer 400, and a minimum distance (with reference to P in FIG. 1) between the curved surface of the light transmitting layer 400 and the light-emitting layer 300 are not particularly limited, those skilled in the art can make flexible choices depending on the practical requirements as long as the requirements are met. As a result, the structure of the display panel is thinned, a flexible display in folded state is achieved, and the anti-reflection performance within the front viewing angle (that is, an angle viewed from the front of the display panel) of the display panel can be increased.

According to the embodiment of the present disclosure, a specific material of the light transmitting layer 400 is not particularly limited, those skilled in the art can make flexible choices depending on the practical requirements as long as the requirements are met. In some embodiments of the present disclosure, the light transmitting layer 400 may be a photoresist. As a result, the flexible display can be realized, and each of the sub-pixel regions is easier to be bent and to be processed, which is suitable for industrial production.

In some embodiment of the present disclosure, the photoresist is a negative photoresist, the material of which includes, for example, acrylate, epoxy, polyurethane, and so on. In this way, the requirements on the curvature radius of the curved surface of the light transmitting layer 400 can be satisfied; moreover, because the materials are widely available, they are readily obtained and have low cost and stable performance.

According to the embodiment of the disclosure, color of the light transmitting layer 400 is not particularly limited, those skilled in the art can make flexible choices depending on the practical requirements as long as the requirements are met. In some embodiments of the present disclosure, the light transmitting layer 400 has a predetermined color, and color of the light-emitting layer 300 and color of the light transmitting layer 400 located in a same sub-pixel region are the same. In some embodiment of the present disclosure, the color of the light transmitting layer 400 arranged on the surface of the light-emitting layer 300 which emits red light away from the substrate 100 is red, the color of the light transmitting layer 400 arranged on the surface of the light-emitting layer 300 which emits green light away from the substrate 100 is green, and the color of the light transmitting layer 400 arranged on the surface of the light-emitting layer 300 which emits blue light away from the substrate 100 is blue. In this way, the light transmitting layer 400 neither absorbs the light emitted by the light-emitting layer 300 nor interferes with the light emitted by the light-emitting layer 300. As a result, the light-emitting effect of the light-emitting layer 300 is better, the contrast of the display panel is increased, and the display effect of the display panel is further increased.

According to the embodiment of the present disclosure, the thickness of the light-emitting layer 300 is not specially limited, those skilled in the art can make flexible choices depending on the practical requirements as long as the requirements are met. In some embodiments of the present disclosure, the thickness of the light-emitting layer 300 is from 500 Å to 900 Å. In some specific embodiments of the present disclosure, the thickness of the light-emitting layer 300 is approximately 500 Å, 600 Å, 700 Å, 800 Å, or 900 Å. In this way, the light-emitting layer 300 has a thinner thickness, high production efficiency and low cost.

According to the embodiment of the present disclosure, the display panel further comprises a pixel definition layer 200. The pixel definition layer 200 is arranged on a surface of the substrate 100 and defines a plurality of the sub-pixel regions 210 which are spaced apart from each other. For example, the plurality of the sub-pixel regions 210 are arranged in an array on the surface of the substrate 100.

In some embodiments of the present disclosure, the pixel definition layer 200 is made of an opaque material, such as a light absorbing material. For example, the pixel definition layer 200 is made of a black light absorbing material. In this way, the reflected light passing through the sub-pixel regions can be absorbed, so that a portion or all of the reflected light in a sub-pixel region will not enter the adjacent sub-pixel region 210, and will not pass through the pixel definition layer 200 to emit out, and therefore, the anti-reflection performance of the side view angle of the display panel is further increased.

According to the embodiment of the present disclosure, a height of the pixel definition layer 200 is not particularly limited, those skilled in the art can make flexible choices depending on the practical requirements as long as the requirements are met. In some embodiments of the present disclosure, the height of the pixel definition layer 200 may be from 1 micron to 3 microns. In some preferred embodiments of the present disclosure, the height of the pixel definition layer 200 may be from 1 micron to 2 microns. In some specific embodiments of the disclosure, the height of the pixel definition layer 200 is approximately 1 micron, 1.2 microns, 1.4 microns, 1.6 microns, 1.8 microns, or 2 microns. In this way, the pixel definition layer 200 is relatively thin, which is conducive to realizing the thinning of the structure of the display panel, and achieving the flexible display in folded state.

According to the embodiment of the present disclosure, the substrate 100 comprises a base substrate and a circuit structure (such as a switching transistor, connecting wires, and so on). The circuit structure is disposed on the base substrate and configured for realize a normal display of the display panel. The specific material type of the base substrate is not particularly limited, those skilled in the art can make flexible choices depending on the practical requirements as long as the requirements are met. In some embodiments of the present disclosure, the specific material type of the base substrate can be flexible plastics such as polyimide. The circuit structure may be a circuit structure used for a conventional display panel, which are omitted herein. In this way, it is conducive to bending the display panel, and further realizing the flexible display in folded state; moreover, because the materials are widely available, they are readily obtained and have low cost.

Figure 2:
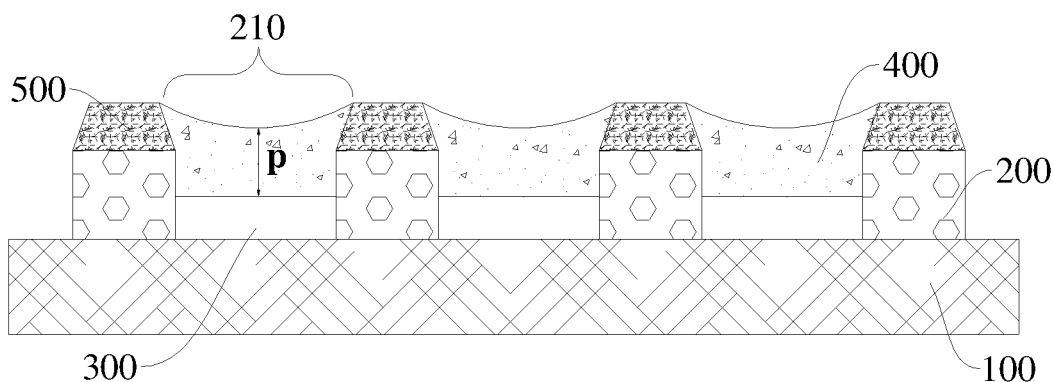
FIG. 2 is a schematic diagram of a section structure of a display panel in another embodiment of the present disclosure.

In another embodiment of the present disclosure, with reference to FIG. 2, the display panel further comprises a black matrix 500. The black matrix 500 is arranged on the surface of the pixel definition layer 200 away from the substrate 100. Because the existence of the black matrix 500, with reference to FIG. 3, the black matrix 500 absorbs the reflected light emitted in side viewing angle (having a certain angle of inclination with respect to the front viewing angle). In this way, not only the anti-reflection performance within the front viewing angle is increased, but also the anti-reflection performance of the side viewing angle of the display panel is further increased, thereby increasing the viewing angle of the display panel and obtaining better display effect.

According to the embodiment of the present disclosure, the specific material of the black matrix 500 is not particularly limited, those skilled in the art can make flexible choices depending on the practical requirements as long as the requirements are met. In some embodiments of the present disclosure, the black matrix 500 may be a black photoresist. The specific material type of the black photoresist is not particularly limited, those skilled in the art can make flexible choices depending on the practical requirements as long as the requirements are met. In some embodiments of the present disclosure, the specific materials of the black photoresist includes acrylate, epoxy, or polyurethane, and so on. Because the materials are widely available, they are readily obtained and have low cost.

According to the embodiment of the present disclosure, the specific shape of the black matrix 500 is not particularly limited, those skilled in the art can make flexible choices depending on the practical requirements as long as the requirements are met. In some embodiments of the present disclosure, with reference to FIG. 2 and FIG. 3, a cross-sectional shape of the black matrix 500 may be a trapezoid. In this way, the operation process is simple and easy to industrialize.

Figure 3:
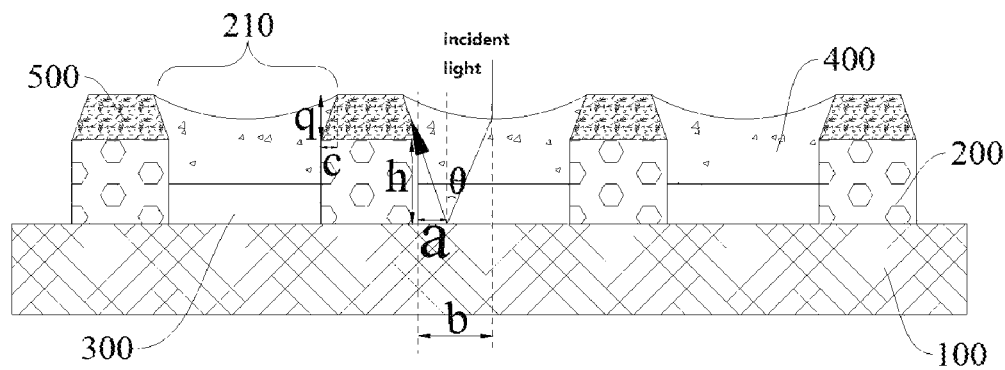
FIG. 3 is a schematic diagram of a working principle of a display panel in an embodiment of the present disclosure.

According to the embodiment of the present disclosure, with reference to FIG. 3, the thickness q of the black matrix 500 is not specially limited, those skilled in the art can make flexible choices depending on the practical requirements as long as the requirements are met. In some embodiments of the present disclosure, the thickness of the black matrix 500 may be from 1 micron to 4 microns. In some specific embodiments of the present disclosure, the thickness of the black matrix 500 may be, for example, 1 micron, 1.5 microns, 2 microns, 2.5 microns, 3 microns, 3.5 microns, or 4 microns. In this way, the process is simple and easy to produce.

According to the embodiment of the present disclosure, with reference to FIG. 3, for the convenience of production, the cross-sectional shape of the black matrix 500 is set as isosceles trapezoid. In order to reduce the reflected light and enhance the anti-reflection performance, all of the reflected lights enter the black matrix 500 or the pixel definition layer 200.

According to the embodiment of the present disclosure, the black matrix and the pixel definition layer can be integrated to simplify the manufacturing process.

According to the embodiment of the present disclosure, in order to further reduce the reflected lights, the curvature radius of the curved surface of the light transmitting layer 400 is adjustable, so that a majority of the lights entering the light transmitting layer 400 from any directions can enter the black matrix 500 or the pixel definition layer 200, thus, better anti-reflection performance is achieved. It is to be noted that, because the area of each of the sub-pixel regions 210 is relatively small, the luminous flux of obliquely incident light is much smaller than that of vertically incident light. Compared with the incident light along a vertical direction (which is also called vertically incident light), the luminous flux of non-vertically incident light is negligible. In the embodiments of the present disclosure, only the vertically incident light is taken into consideration. In addition, compared with the luminous flux of the lights incident on a whole of the sub-pixel region 210, the luminous flux of the light vertically incident on the central point of each of the sub-pixel regions is relatively small. Thus, the light being vertically incident on the central point of each of the sub-pixel regions is negligible in the present disclosure.

According to the embodiment of the present disclosure, with reference to FIG. 3 to FIG. 6 (the incident lights shown in FIG. 3 to FIG. 6 are infinitely close to a central line of the light transmitting layer 400), "k" is defined as a distance between an incident point on the substrate and an edge of the pixel definition layer 200 closest to the incident point; herein, the incident point refers to the point where the external incident light infinitely close to the center of the light transmitting layer 400 is incident on the substrate after it passes through the light transmitting layer 400. In order to ensure that the external incident lights entering the light transmitting layer 400 from any points of the surface of the light transmitting layer 400 can be reflected and then enter the black matrix 500 or the pixel definition layer 200, it is possible to adjust the curvature radius of the light transmitting layer 400. By adjusting the curvature radius of the light transmitting layer 400, the external incident lights entering the light transmitting layer 400 from a point infinitely close to the center of the light transmitting layer 400 can be reflected by the substrate and then enters the black matrix 500 or the pixel definition layer 200.

Figure 4:
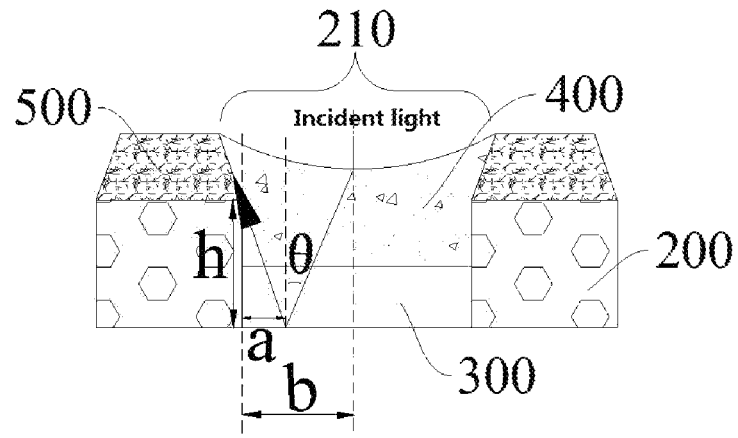
FIG. 4 is a partial schematic diagram of a single pixel unit in the display panel of FIG. 3.

According to the embodiment of the present disclosure, with reference to FIG. 3 and FIG. 4, considering that the external incident lights are refracted and reflected only in a same sub-pixel region 210, the critical condition that allows all the external incident lights entering the light transmitting layer 400 from a point infinitely close to the center of the light transmitting layer 400 to be reflected by the substrate and then enter the black matrix 500 is obtained from the refraction law and as follows: the light reflected by the substrate 100 propagates along an direction completely coinciding with waists of the isosceles trapezoid of the cross section of black matrix 500. While in the critical condition, the external incident lights entering the light transmitting layer 400 from a point infinitely close to the center of the light transmitting layer 400 is reflected by the substrate to form the reflected lights, and the reflected lights propagates along directions completely coincide with waists of the isosceles trapezoid of the cross section of the black matrix 500, at this time, "a" is defined as a distance between the incident point where the external incident light infinitely close to the center of light transmitting layer is incident on the substrate 100 and the edge of the pixel definition layer 200 closest to the incident point.

Figure 5:
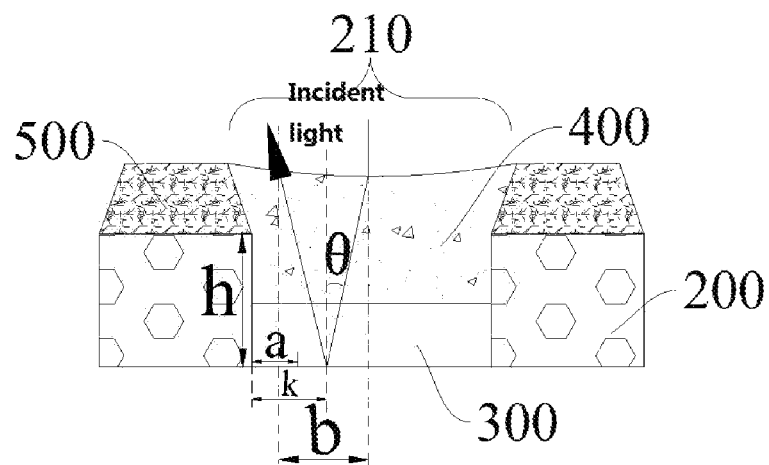
FIG. 5 is a partial schematic diagram of a single pixel unit of a display panel in another embodiment of the present disclosure.

According to the embodiment of the present disclosure, with reference to FIG. 5, after the curvature radius of the light transmitting layer 400 is adjusted, the incident light entering from a point infinitely close to the center of the light transmitting layer 400 is reflected by the substrate 100 along a reflection direction and emitted from the light transmitting layer 400, herein, the reflection direction deviates from the waists of the isosceles trapezoid of the cross section of the black matrix 500. In this situation, the reflected lights still exists (at this time k>a).

Figure 6:
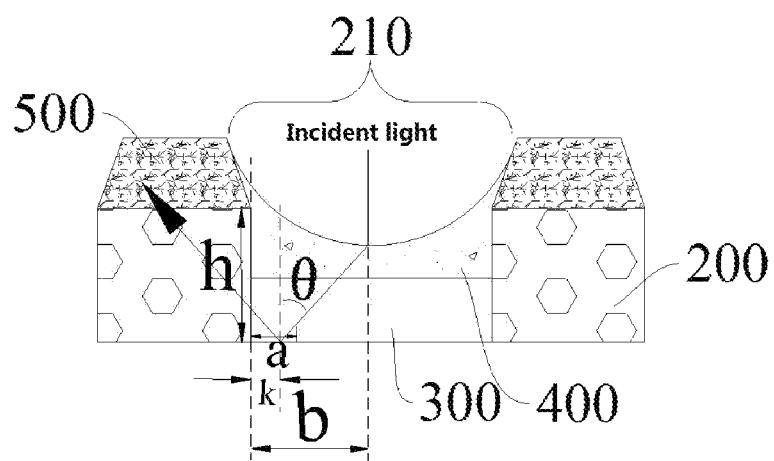
FIG. 6 is a partial schematic diagram of a single pixel unit of a display panel in still another embodiment of the present disclosure.

According to the embodiment of the present disclosure, with reference FIG. 6, after the curvature radius of the light transmitting layer 400 is adjusted, the incident light entering from a point infinitely close to the center of the light transmitting layer 400 is reflected by the substrate 100 along a reflection direction and enters the light transmitting layer 400, herein, the reflection direction deviates from the waists of the isosceles trapezoid of the cross section of the black matrix 500. In an embodiment, the pixel definition layer 200 is light-transmissive, and the reflected light enters the black matrix 500. In other embodiments of the present disclosure, the pixel definition layer 200 is opaque. For example, the pixel definition layer 200 is made of a black light absorbing material, such that the pixel definition layer 200 absorbs the reflected light, and the reflected light will directly enter the pixel definition layer 200 and will be absorbed by the pixel definition layer 200 (in both of the above-mentioned situations, k<a).

In summary, according to the embodiment of the present disclosure, considering that the incident light are refracted and reflected only in a same sub-pixel region 210, the light can enter the black matrix 500 or the pixel definition layer 200 while k satisfies: k≤a. That is to say, in the embodiment of the present disclosure, by adjusting the curvature radius of the curved surface of the light transmitting layer 400, the distance k between the incident point on the substrate 100 and the edge of the pixel definition layer 200 satisfies k≤a (herein, the incident point refers to the point where the incident light entering from a point infinitely close to the center of the light transmitting layer is incident on the substrate 100), so that the light can enters the black matrix 500. In this way, the reflection lights are reduced and the anti-reflection performance is enhanced.

According to the embodiment of the present disclosure, with reference to FIG. 3 (it is noted that, a refractive index of air is quite different from the refractive index of the light transmitting layer 400, the refractive index of the light transmitting layer 400 is closer to the refractive index of the light-emitting layer 300, and the thickness of the light-emitting layer 300 is much smaller than the thickness of the light transmitting layer 400. In comparison with the deflection of the lights entering from the air to the light transmitting layer 400, the deflection of the lights entering from the light transmitting layer 400 to the light-emitting layer 300 is negligible. Thus, the deflection of the light entering from the light transmitting layer 400 to the light-emitting layer 300 is not taken into consideration in the present disclosure), while it is under the critical condition:

according to the basic principle of plane geometry, it can be obtained that $\tan\theta = a/h$ (it is noted that $\theta$ herein is an angle between the external incident light entering the light-emitting layer 300 and a normal line on the substrate 100);

according to the basic relationship between the focal length F of a concave lens and the diameter b of a spot, there is: $\tan\theta = b/2F$ (the basic relationship between the focal length F of a concave lens and the diameter b of a spot may be referenced to XU Shanghua, The Research of Focal Length changed in Long Distance Welding, Optical Engineering, Huazhong University of Science & Technology, 2012);

according to the basic formula for calculating the focal length of the concave lens, there is: $F = (n-1)/R$;

In combination of the above three formulas, the formula of calculating the curvature radius of the curved surface of the light transmitting layer 400 can be obtained and as below: $R = 2a \times n - 1/(b \times h)$. Thus, in the case that the curvature radius R is controlled to be equal to or smaller than $2a \times (n-1)/(b \times h)$ (i.e., $R \leq 2a \times (n-1)/(b \times h)$, it makes contributions to the divergence of the ambient incident light. After the ambient incident light is diverged by the curved surface of the light transmitting layer 400, the diverged light is reflected on the surface of the substrate 100. The reflected direction deviates from the original incident direction, so that it cannot be output within the front viewing angle of the display panel, in this way, the anti-reflection performance within the front viewing angle of the display panel is increased.

According to the embodiment of the present disclosure, furthermore, the color of the pixel definition layer 200 is black, alternatively, the color of the pixel definition layer 200 is black and at the same time the pixel definition layer 200 contains the light absorbing material. Thus, the reflected light can be absorbed by the pixel definition layer 200. A portion of, even all of the reflected lights in a sub-pixel region 210 will neither enter the adjacent sub-pixel region 210, nor emitted from the pixel definition layer 200, thus the anti-reflection performance within the side view angle of the display panel is further increased.

According to the embodiment of the present disclosure, with reference to FIG. 3, in the present disclosure, the section shape of the black matrix 500 is an isosceles trapezoid. In this case, according to the plane geometry theorem, there is $a = (c \times h)/q$ under the above critical condition. In the actual production process, the specific value of "a" under the critical condition can be determined by the parameters "c," "q," and "h"; herein, "c" is a half of a length difference between an upper base and a lower base of the isosceles trapezoid of the black matrix 500, "q" is the thickness of the black matrix 500, and "h" is the height of the pixel definition layer 200. Furthermore, according to various actual situations where the display panel described in the present disclosure is applied, the spot diameter b of the incident light, a refractive index n of the light transmitting layer 400, and the height h of the pixel definition layer 200 can be selected according to actual requirements. The curvature radius R can be calculated according to the formulas mentioned above. At the same time, the curvature radius R may also depend on the spot diameter b, the refractive index n of the light transmitting layer 400, and the height h of the pixel definition layer 200. Considering the above parameters, the computer assistant technology may be used to simulate the actual situation according to the actual situation, in order to make the best choice of the parameters. Thus, the black matrix 500 can absorb the reflected light emitted within the side viewing angle. On the basis of increasing the anti-reflection performance of the front viewing angle, the anti-reflection performance within the side viewing angle of the display panel is also strengthen, the viewing angle is increased and the display effect is promoted.

According to the embodiment of the present disclosure, after the external incident light entering the light transmitting layer 400 from a point infinitely close to the center of the light transmitting layer 400 and is reflected by the substrate, the reflected light coincides with the sides of section of the black matrix 500. In this case, in the formula for calculating the curvature radius of the curved surface of the light transmitting layer 400, the distance a between the incident point of the incident light on the substrate 100 and the edge of the pixel definition layer 200, the spot diameter b of the incident light, the refractive index n of the light transmitting layer 400, and the range of the height h of the pixel definition layer 200 are not particularly limited, those skilled in the art can make flexible choices depending on the practical requirements as long as the requirements are met. In some embodiments of the present disclosure, the parameter a ranges from 0.1 micron to 6 microns, the parameter b ranges from 5 microns to 20 microns, the parameter n ranges from 1.4 to 1.8, and the parameter h ranges from 1 micron to 3 microns. In some specific embodiments of the present disclosure, the parameter a is approximately 0.1 micron, 1 micron, 2 microns, 3 microns, 4 microns, 5 microns, or 6 microns; the parameter b is approximately 5 microns, 10 microns, 15 microns, or 20 microns; the parameter n is approximately 1.4 microns, 1.5 microns, 1.6 microns, 1.7 microns, or 1.8 microns; and the parameter h is approximately 1 micron, 1.5 microns, 2 microns, 2.5 microns, or 3 microns. Thus, the reflection light cannot be emitted within the front viewing angle, but within the side viewing angle of the display panel, which increases the anti-reflection performance within the front viewing angle of the display panel.

According to the embodiment of the present disclosure, the incident lights may pass through the pixel definition layer 200 and be refracted and reflected in a plurality of sub-pixel regions 210, additionally, in the present disclosure, the curvature radius R under the critical condition is not only the function of the parameter a, but also the function of the spot diameter b of the incident light, the refractive index n of the transmitting layer 400, and the height h of the pixel definition layer 200. In view of these, those skilled in the art may use the computer assistant technology to simulate the actual situation on the basis of the formula of R=2a×(n−1)/ (b×h), which is used for calculating the curvature radius of the curved surface of the light transmitting layer 400 under the critical condition, so as to select the most suitable values of parameters a, b, h and n, and make the parameters cooperate with each other. In this way, the curvature radius of the light transmitting layer 400 is adjusted, so that the incident light can be refracted and reflected in an only single sub-pixel region 210. In this way, except a part of lights incident on an center of the curved surface of the light transmitting layer 400, the remaining part of lights incident on the substrate 100 along a direction perpendicular to the substrate 100 are reflected by the substrate 100 and then enter the black matrix 500.

According to the embodiment of the present disclosure, the incident lights may pass through the pixel definition layer 200 and be refracted and reflected in a plurality of sub-pixel regions 210. In view of this, besides the computer assistant technology used for simulating the actual situation to select the most suitable values of parameters a, b, h and n, the pixel definition layer 200 may further be made of the black opaque light absorbing material, in order to prevent incident light from being reflected into other sub-pixel regions 210, that is, to make the incident light be refracted and reflected in only single sub-pixel region 210. In this way, except a part of lights incident on an center of the curved surface of the light transmitting layer 400, the remaining part of lights incident on the substrate 100 along a direction perpendicular to the substrate 100 are reflected by the substrate 100 and then enter the black matrix 500 or the pixel definition layer 200.

According to the embodiment of the present disclosure, the minimum distance between the curved surface of the light transmitting layer 400 and the light-emitting layer 300 (with reference to P in FIG. 2) is not particularly limited, those skilled in the art can make flexible choices depending on the practical requirements as long as the requirements are met. In some embodiments of the present disclosure, the minimum distance between the curved surface of the light transmitting layer 400 and the light-emitting layer 300 is from 1 micron to 3.5 microns. In some specific implementations of the present disclosure, the minimum distance between the curved surface of the light transmitting layer 400 and the light-emitting layer 300 is approximately 1 micron, 1.5 microns, 2 microns, 2.5 microns, 3 microns, or 3.5 microns. In this way, the curvature radius of the curved surface of the light transmitting layer 400 can be satisfied, and the anti-reflection performance of the display panel can be further enhanced.

Figure 7:
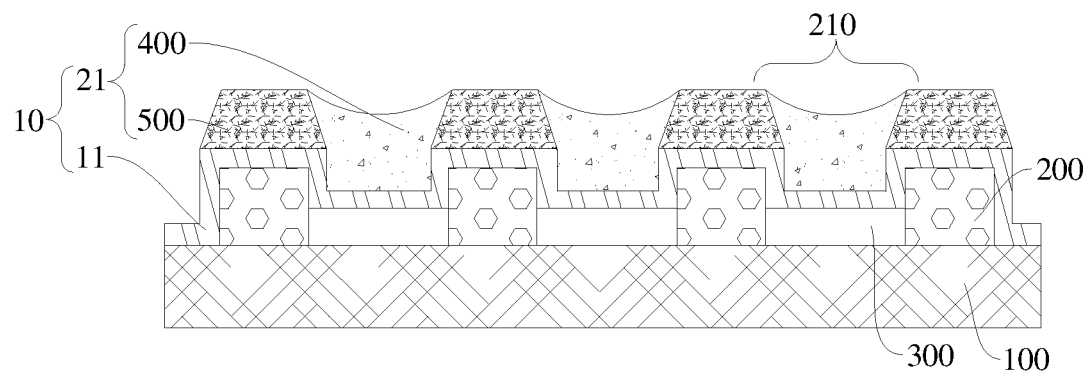
FIG. 7 is a schematic diagram of a section structure of a display panel in still another embodiment of the present disclosure.

According to other embodiments of the present disclosure, with reference to FIG. 7, the display panel further comprises an encapsulating film 10 (it is noted that, lights can directly penetrate the encapsulating film 10 because the thickness of the encapsulating film 10 is relatively thin, and the respective films in the encapsulating film 10 do not affect the light emission. In addition, because the refractive indices of each of the films in the encapsulating film 10 is similar to each other, the deflection of light entering each of the films in the encapsulating film 10 can be negligible. In the present disclosure, the deflection of light entering each of the films in the encapsulating film 10 is not taken into consideration, and the curvature radius formula described above is still true). The encapsulating film 10 is arranged on both the surface of the pixel definition layer 200 and the surface of the light-emitting layer 300 far away from the substrate 100. The encapsulating film 10 comprises at least a first inorganic layer 11 and a first organic layer 21 which are stacked together. The first inorganic layer 11 is arranged on both the surface of the pixel definition layer 200 and the surface of the light-emitting layer 300 far away from the substrate 100, that is, first inorganic layer 11 overlays the entire pixel definition layer 200 and the entire light-emitting layer 300. The first organic layer 21 is arranged on the surface of the first inorganic layer 11 away from the substrate 100. For example, the black matrix 500 and the light transmitting layer 400 together constitute the first organic layer 21. Because the light transmitting layer 400 serves as the organic layer of the film encapsulating of the display panel, the structure of the display panel can be further thinned. Moreover, the organic layers are independent of each other, and it is difficult to pull each other when bending, so that it is easier to bend the organic layer compared to the existing display panel, and can further realize the flexible display in folded state.

Figure 8:
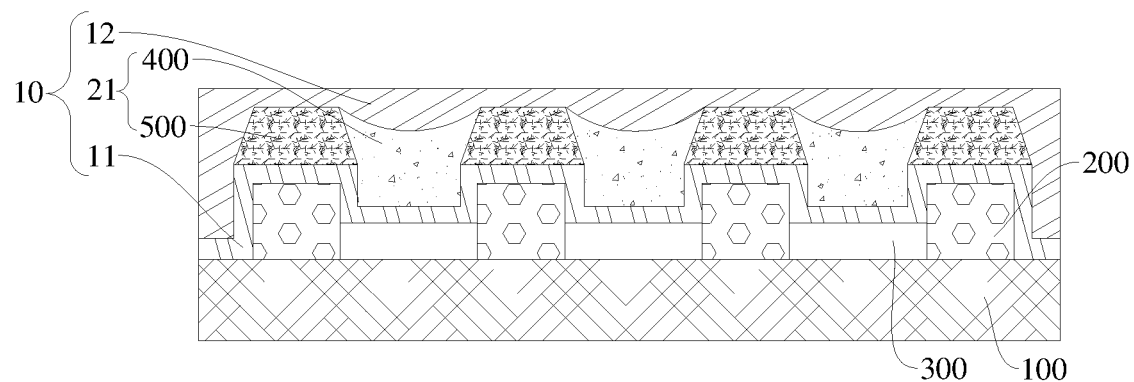
FIG. 8 is a schematic diagram of a section structure of a display panel in yet another embodiment of the present disclosure.
Figure 9:
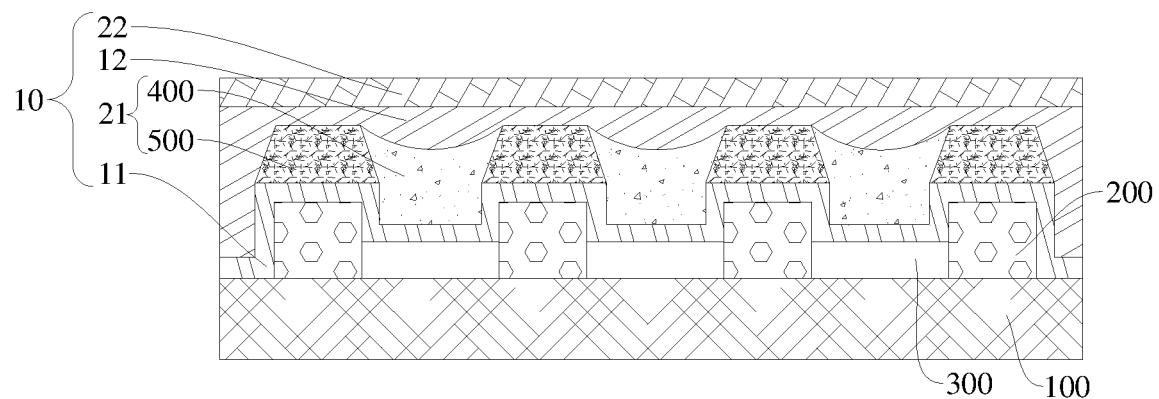
FIG. 9 is a schematic diagram of a section structure of a display panel in another embodiment of the present disclosure.
Figure 10:
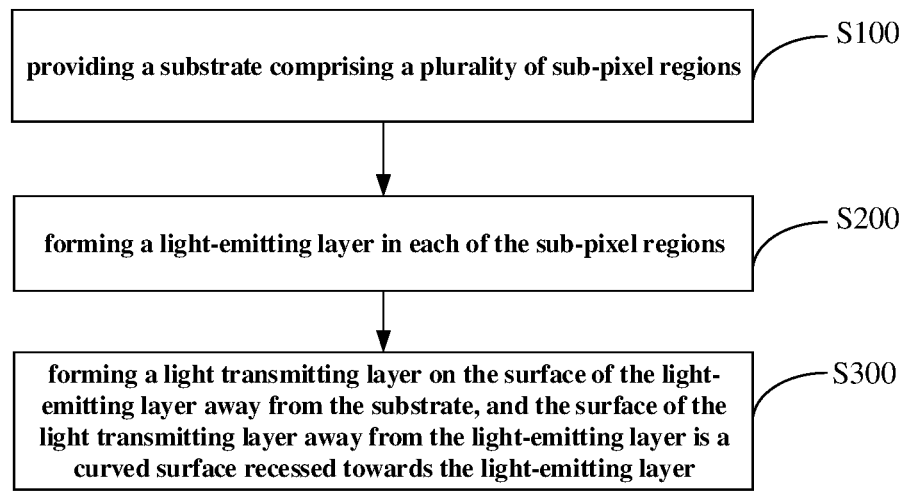
FIG. 10 is a schematic flowchart of a method of manufacturing a display panel in an embodiment of the present disclosure.

In some other embodiments of the present disclosure, with reference to FIG. 8 and FIG. 9, the encapsulating film 10 further comprises at least one of a second inorganic layer 12 and a second organic layer 22 which are alternately arranged. It is noted that, the wordings "the encapsulating film further comprises at least one of a second inorganic layer and a second organic layer which are alternately arranged" of the present disclosure means that the encapsulating film further comprises at least one layer. In a case that the encapsulating film further comprises only a layer and the layer is an inorganic layer, the structure may be referenced to FIG. 8. FIG. 8 illustrates that the encapsulating film further comprises only the second inorganic layer 12. In a case that the encapsulating film further comprises two layers, and the two layers are an inorganic layer and an organic layer stacked together, the structure may be referenced to FIG. 9. FIG. 9 illustrates that the encapsulating film further comprises the second inorganic layer 12 and the second organic layer 22 which are stacked together. In a case that the encapsulating film further comprises three layers, the three layers are an inorganic layer, an organic layer, and an inorganic layer which are sequentially stacked together, and the like. Thus, the film encapsulating effect can be further increased.

According to the embodiment of the present disclosure, the specific material types of the first inorganic layer 12 and the second organic layer 22 are not particularly limited, those skilled in the art can make flexible choices depending on the practical requirements as long as the requirements are met. In some embodiments of the present disclosure, the specific materials of the first inorganic layer 12 may comprise silicon nitride, silicon oxynitride, silicon oxide, titanium dioxide, alumina, and so on. As a result, the encapsulating effect can be better, because the materials are widely available, they are readily obtained and have low cost.

According to the embodiment of the present disclosure, a thicknesses of the first inorganic layer 12 and a thicknesses of the second organic layer 22 are not specially limited, those skilled in the art can make flexible choices depending on the practical requirements as long as the requirements are met. In some embodiments of the present disclosure, the thicknesses of the first inorganic layer 12 and the thicknesses of the second organic layer 22 may be 1000 Å to 20000 Å respectively. In some specific embodiments of the present disclosure, the thickness of the first inorganic layer 12 is approximately 1000 Å, 5000 Å, 15000 Å, or 20000 Å. The thickness of the second organic layer 22 is similar to that of the first inorganic layer 12. Thus, both the first inorganic layer 12 and the second organic layer 22 have a thinner thickness and a better light transmittance, which makes no influence on the light emitted by the light-emitting layer 300, and a better display effect is achieved. At the same time, the material is saved and the cost is reduced under the premise of the better encapsulating effect.

In the embodiment of the present disclosure, the display panel, for example, is an organic electroluminescent display panel, such as an organic light-emitting diode (OLED) display panel, so that the light-emitting layer disposed in each of the sub-pixel regions can be understood as a light-emitting unit. In at least some embodiments, a first electrode (for example, an anode), an organic functional layer and a second electrode (for example, a cathode) are arranged in each of the light-emitting units. The anode and the cathode are configured for driving the organic light-emitting material to emit light for display operation. For example, the organic functional layer comprises a light-emitting material layer, an electron injection layer, an electron transport layer, a hole injection layer and a hole transport layer.

In at least one embodiment of the present disclosure, the display panel, for example, is an inorganic electroluminescent display panel, such as a quantum dot light-emitting (QLED) display panel. In at least some embodiments, each of the light-emitting units is provided with a first electrode (for example, the anode), a quantum dot light-emitting layer and a second electrode (for example, the cathode). The anode or the cathode is used for driving the quantum dot light-emitting layer to emit light for display operation.

Another embodiment of the present disclosure provides a display device. According to the embodiment of the present disclosure, the display device comprises the display panel mentioned above. The display device can realize a flexible display in folded state, which increases the anti-reflection performance within the front viewing angle of the display panel, and has all the features and advantages of the display panel mentioned above, which are omitted herein.

According to the embodiment of the present disclosure, the shape, the structure and the manufacturing process of the display device are not particularly limited, those skilled in the art can make flexible choices depending on the practical requirements as long as the requirements are met. It can be understood by those skilled in the art, besides the display panel mentioned above, the display device has the structure of a conventional display device, which are omitted herein.

According to the embodiment of the present disclosure, the specific type of the display device is not particularly limited. For example, the display device includes, but not limited to, a mobile phone, a tablet computer, a wearable device, a game machine, etc.

Figure 11A:
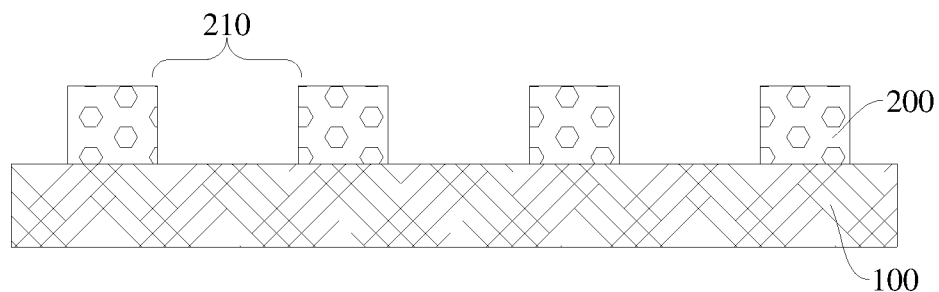
FIG. 11a to FIG. 11c are schematic structural diagrams of each step in a method of manufacturing a display panel in another embodiment of the present disclosure.

Another embodiment of the present disclosure provides a manufacturing method of a display panel. According to the embodiment of the present disclosure, with reference to FIG. 10 and FIG. 11a to FIG. 11c, the method comprises:

S100: providing a substrate, the substrate comprising a plurality of sub-pixel regions, as illustrated in FIG. 11a.

According to the embodiment of the present disclosure, in the step, for example, a pixel definition layer 200 is formed on one of surfaces of the substrate 100. The pixel definition layer 200 defines a plurality of sub-pixel regions 210 which are spaced apart from each other. The specific process of forming the pixel definition layer 200 is not particularly limited, those skilled in the art can make flexible choices depending on the practical requirements as long as the requirements are met. In some embodiments of the present disclosure, the specific process for forming the pixel definition layer 200 may comprise a patterning processing such as photolithography. As a result, the operation is simple, convenient, and easy to realize, and easy to industrialize production with a high yield and a low cost.

Figure 11B:
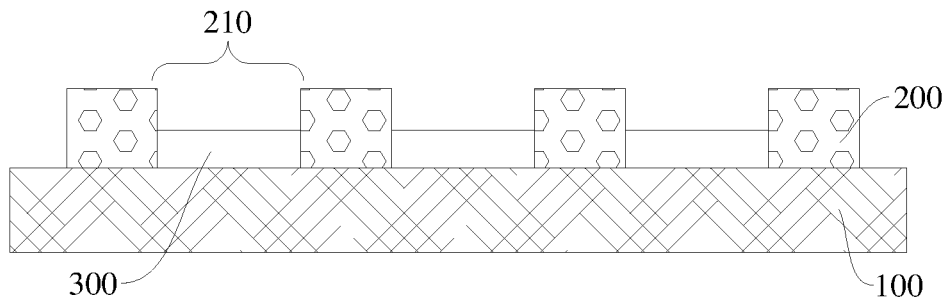

S200: forming a light-emitting layer 300 in each of the sub-pixel regions 210, as illustrated in FIG. 11b.

According to the embodiment of the present disclosure, the specific process for forming the light-emitting layer 300 is not particularly limited, those skilled in the art can make flexible choices depending on the practical requirements as long as the requirements are met. In some embodiments of the present disclosure, the specific processes for forming the light-emitting layer 300 may comprise vacuum evaporation, chemical vapor deposition, spin coating, and inkjet printing. As a result, the operation is simple, convenient, and easy to realize, and easy to industrialize production with a high yield and a low cost.

Figure 11C:
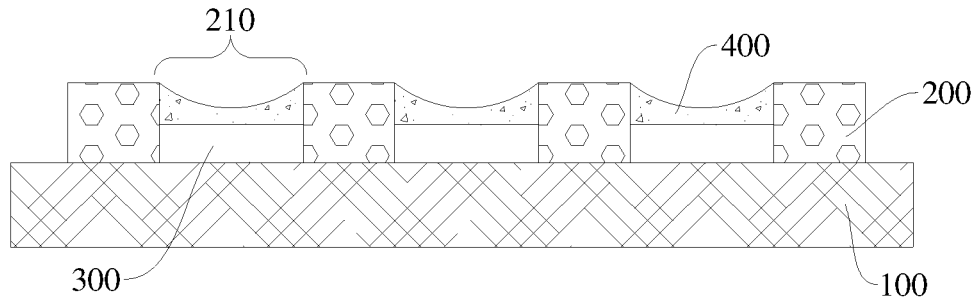
Figure 12:
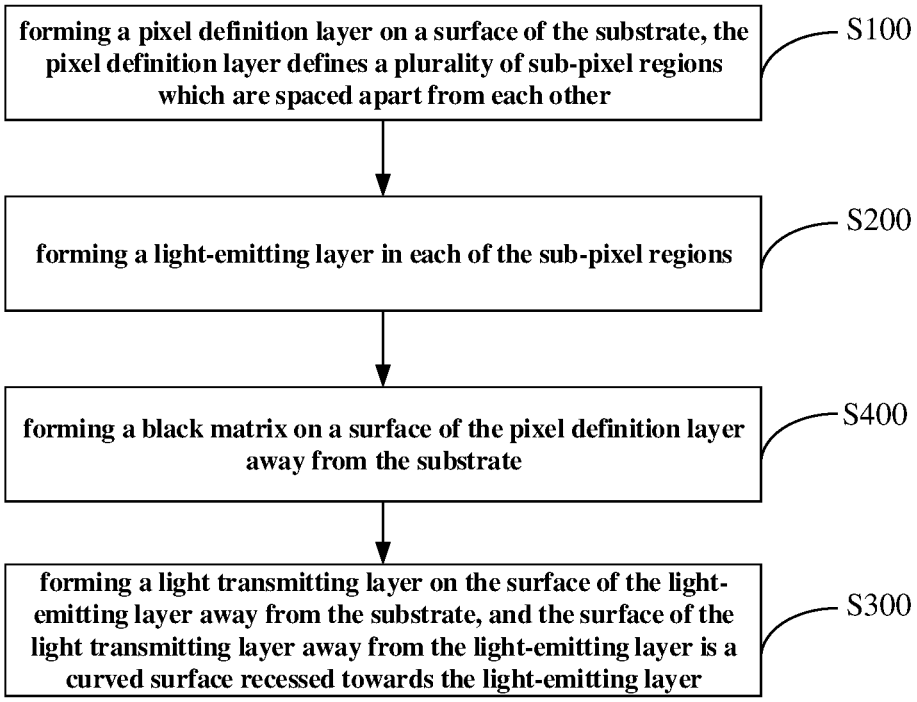
FIG. 12 is a schematic flowchart of a method of manufacturing a display panel in still another embodiment of the present disclosure.

S300: forming a light transmitting layer 400 on the surface of the light-emitting layer 300 away from the substrate 100, and the surface of the light transmitting layer 400 away from the light-emitting layer 300 is a surface recessed towards the light-emitting layer 300, as illustrated in FIG. 11c.

According to the embodiment of the present disclosure, the specific process for forming the light transmitting layer 400 is not particularly limited, those skilled in the art can make flexible choices depending on the practical requirements as long as the requirements are met. For example, patterned processing such as photolithography can be included but not limited to. In some embodiments of the present disclosure, the specific process for forming the light transmitting layer 400 is photolithography or inkjet printing. Thus, by adjusting the specific parameters in the process, such as exposure time, temperature, development, photoresist coating, baking, and so on, the curved surface of the light transmitting layer 400 can be formed. The operation is simple, convenient, and easy to realize, and easy to industrialize production with a high yield and a low cost. In the present disclosure, the photolithography process comprises coating photoresist material, exposure, and development, etc.

According to the embodiment of the present disclosure, the light transmitting layer 400 has a predetermined color, and color of the light-emitting layer 300 and color of the light transmitting layer 400 located in a same sub-pixel region are the same. Thus, the light transmitting layer 400 neither absorbs the light emitted by the light-emitting layer 300 nor interferes with the light emitted by the light-emitting layer 300. In this way, the light effect emitted by the light-emitting layer 300 is better. Furthermore, the structure of the display panel is thinned, the flexible display in folded state is achieved, the anti-reflection performance of the front viewing angle is increased, and the display effect of the display panel is further increased.

Figure 13A:
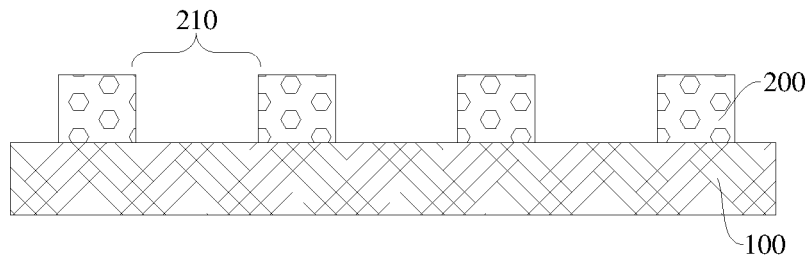
FIG. 13a to FIG. 13d are schematic structural diagrams of each step in a method of manufacturing a display panel in yet another embodiment of the present disclosure.
Figure 13B:
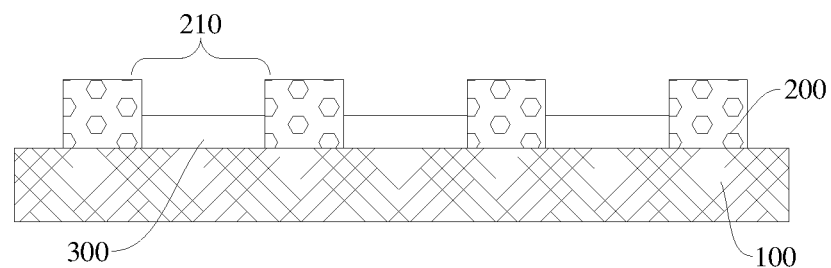
Figure 13C:
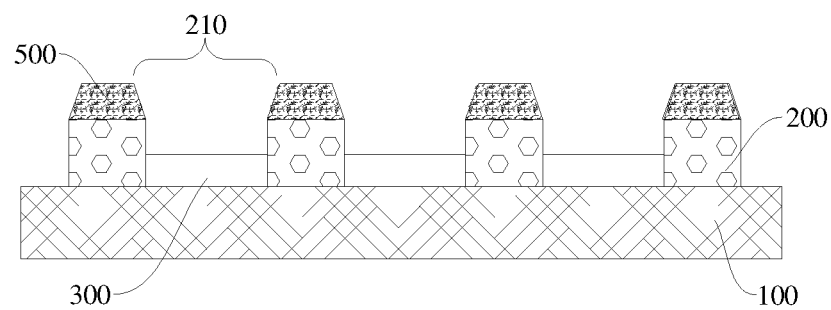
Figure 13D:
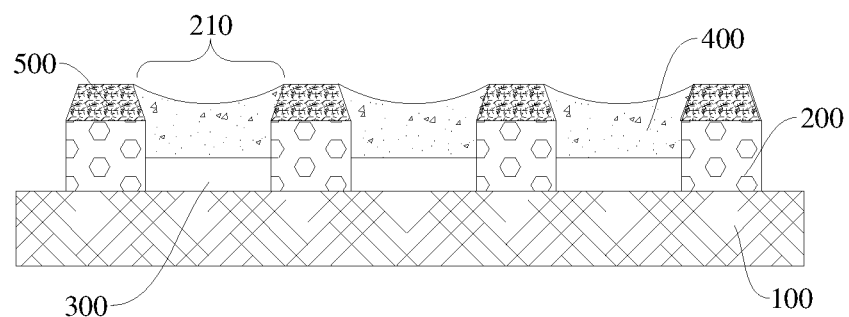
Figure 14:
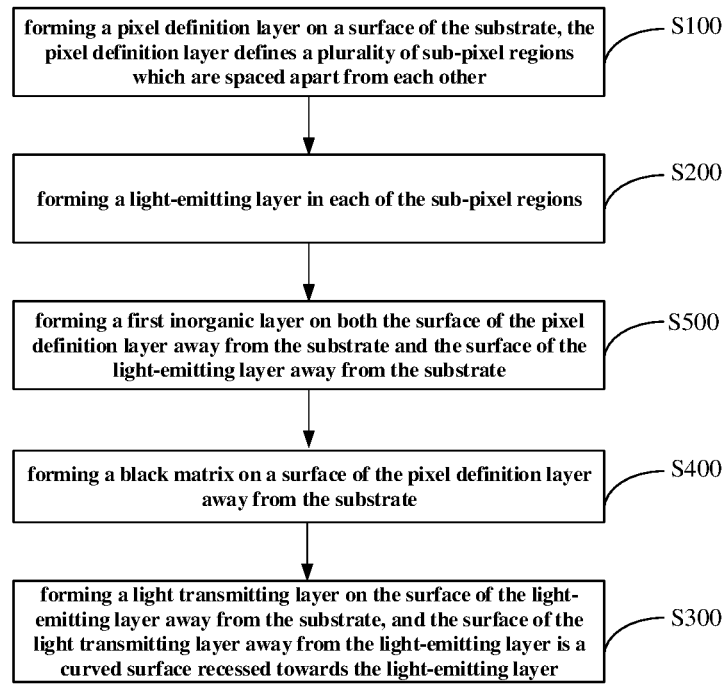
FIG. 14 is a schematic flowchart of a method of manufacturing a display panel in yet another embodiment of the present disclosure.

In another embodiment of the present disclosure, with reference to FIG. 12 and FIG. 13a to FIG. 13d, before forming the light transmitting layer 400, the method further comprising:

S400: forming a black matrix 500 on a surface of the pixel definition layer 200 away from the substrate 100, as illustrated in FIG. 13c.

According to the embodiment of the present disclosure, the specific process for forming the black matrix 500 is not particularly limited, those skilled in the art can make flexible choices depending on the practical requirements as long as the requirements are met. In some embodiments of the present disclosure, the specific process for forming the black matrix 500 may comprise patterning processing such as photolithography. As a result, the operation is simple, convenient, and easy to realize, and easy to industrialize production with a high yield and a low cost.

According to the embodiment of the present disclosure, in addition to forming a black matrix 500 on the surface of the pixel definition layer 200 away from the substrate 100 before forming the light transmitting layer 400, the other manufacturing steps of the display panel in the present embodiment are the same as those described in aforementioned embodiments, and are omitted herein.

Figure 15A:
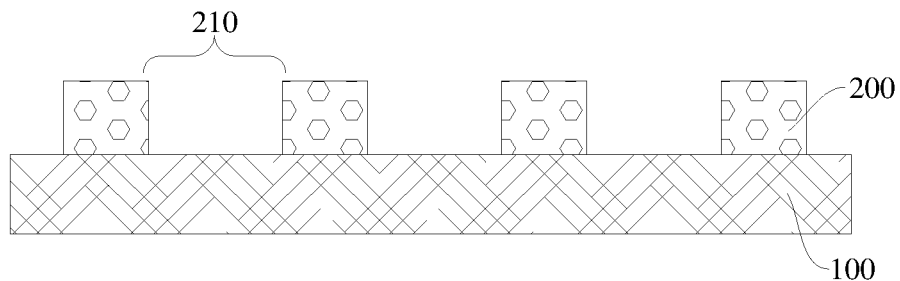
FIGS. 15a to 15e are schematic structural diagrams of each step in a method of manufacturing a display panel according to yet another embodiment of the present disclosure.
Figure 15B:
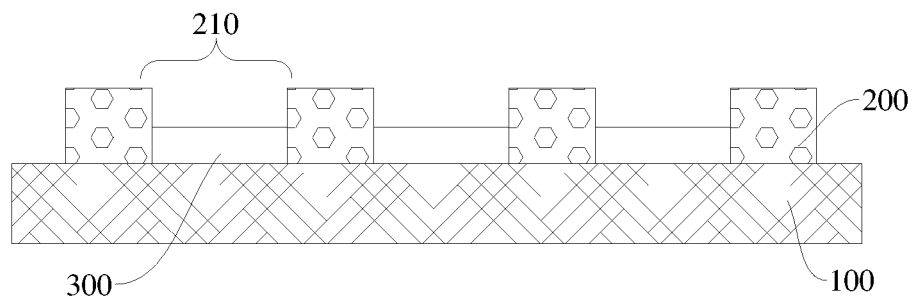
Figure 15C:
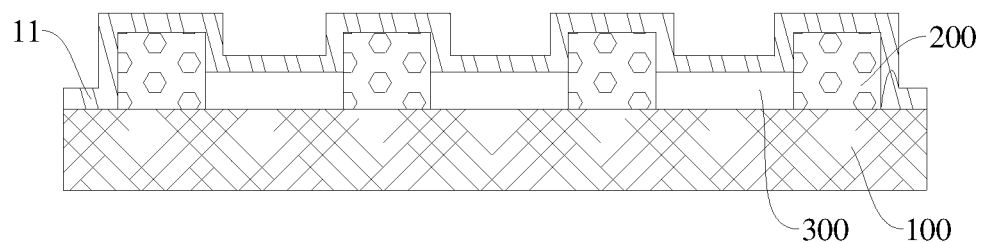
Figure 15D:
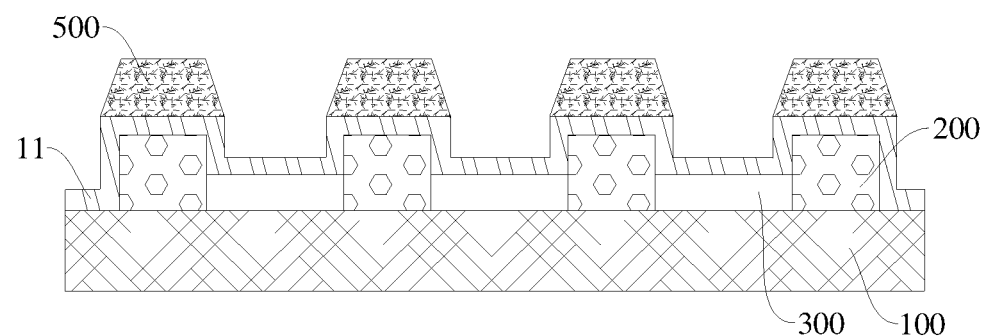
Figure 15E:
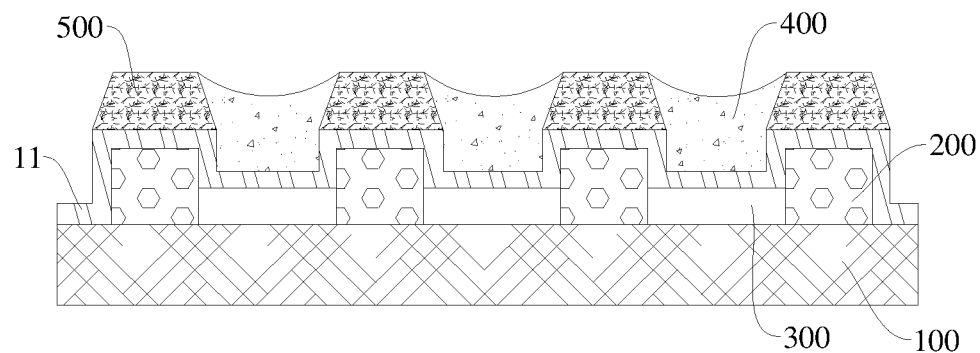

In other embodiments of the present disclosure, with reference to FIG. 14 and FIG. 15a to FIG. 15e, before forming the light transmitting layer 400 and the black matrix 500, the method further comprises:

S500: forming a first inorganic layer 11 on both the surface of the pixel definition layer 200 away from the substrate 100 and the surface of the light-emitting layer 300 away from the substrate 100, as illustrated in FIG. 15c.

According to the embodiment of the present disclosure, the specific process for forming the first inorganic layer 11 is not particularly limited, those skilled in the art can make flexible choices depending on the practical requirements as long as the requirements are met. In some embodiments of the present disclosure, the specific processes for forming the first inorganic layer 11 may include, but are not limited to, physical vapor deposition such as vacuum evaporation, sputtering, ion plating, atomic layer deposition, or plasma enhanced chemical vapor deposition, etc. As a result, the operation is simple, convenient, and easy to realize, and easy to industrialize production with a high yield and a low cost.

According to the embodiments of the present disclosure, in addition to forming the first inorganic layer 11, the display panel in the present embodiment may further comprise the second inorganic layer, the second organic layer, etc, which mentioned in the afore-mentioned embodiments. The specific materials and arranging methods are the same as those described in the afore-mentioned embodiments, so they are omitted herein.

In the present disclosure, the following points need to be explained:

(1) The drawings of the embodiments of the present disclosure are only related to the structures related to the embodiments of the present disclosure, and other structures can refer to general designs.

(2) For clarity, in the drawings for describing the embodiments of the present disclosure, a thickness of a layer or a thickness of a region is exaggerated or reduced, that is, these drawings are not drawn according to an actual scale.

(3) In the absence of conflict, the embodiments of the present disclosure and the features in the embodiments can be combined with each other to obtain new embodiments.

What is described above is related to the illustrative embodiments of the disclosure only and not limitative to the scope of the disclosure. Therefore, the scopes of the disclosure are defined by the accompanying claims.

What is claimed is:

1. A display panel, comprising:
a substrate, comprising a plurality of sub-pixel regions;
a light-emitting layer, disposed in each of the plurality of sub-pixel regions;
a light transmitting layer, disposed on a surface of the light-emitting layer away from the substrate, a surface of the light transmitting layer away from the light-emitting layer being a curved surface recessed towards the light-emitting layer;
a pixel definition layer, disposed on a surface of the substrate and defining the plurality of the sub-pixel regions which are spaced apart from each other;
a black matrix, disposed on a surface of the pixel definition layer away from the substrate;
wherein a curvature radius R of the curved surface of the light transmitting layer satisfies: $R \leq 2a \times (n-1)/(b \times h)$, wherein an external incident light infinitely close to a center of the light transmitting layer is incident on an incident point of the substrate and then reflected by the substrate to form a reflect light, the reflect light coincides with a side of a cross section of the black matrix, wherein a is a distance between the incident point on the substrate and an edge of the pixel definition layer closest to the incident point, b is a spot diameter of the external incident light, n is a refractive index of the light transmitting layer, and h is a height of the pixel definition layer.

2. The display panel according to claim 1, wherein the pixel definition layer is made of an opaque material.

3. The display panel according to claim 1, wherein the light transmitting layer has a predetermined color, and the light-emitting layer located in a same sub-pixel region as the light transmitting layer has a color same as the predetermined color of the light transmitting layer.

4. The display panel according to claim 1, wherein a material of the light transmitting layer comprises a photoresist.

5. The display panel according to claim 4, wherein the photoresist comprises one or more selected from the group consisting of acrylate, epoxy, and polyurethane.

6. The display panel according to claim 1, wherein a minimum distance between the curved surface of the light transmitting layer and the light-emitting layer is from 1 micron to 3.5 microns.

7. The display panel according to claim 1, wherein parameters R, b, h, n, and a are set such that among lights incident on the substrate along a direction perpendicular to the substrate, except a part of lights incident on a center of the curved surface, remaining part of lights are reflected by the substrate and then enter at least one of the pixel definition layer and the black matrix.

8. The display panel according to claim 1, further comprising an encapsulating film, wherein the encapsulating film is disposed on both the surface of the pixel definition layer away from the substrate and the surface of the light-emitting layer away from the substrate, and the encapsulating film comprises at least a first inorganic layer and a first organic layer which are stacked,
wherein the first inorganic layer is disposed on both the surface of the pixel definition layer away from the substrate and the surface of the light-emitting layer away from the substrate, the first organic layer is disposed on a surface of the first inorganic layer away from the substrate, and the black matrix and the light transmitting layer together constitute the first organic layer.

9. The display panel according to claim 8, wherein the encapsulating film further comprises a second inorganic layer, wherein the second inorganic layer overlays the first organic layer.

10. The display panel according to claim 8, wherein the encapsulating film further comprises a second inorganic layer and a second organic layer, and the encapsulating film comprises the first inorganic layer, the first organic layer, the second inorganic layer and the second organic layer which are stacked in sequence.

11. A display device, comprising the display panel according to claim 1.

12. A manufacturing method of a display panel, comprising:
providing a substrate, the substrate comprises a plurality of sub-pixel regions;
forming a light-emitting layer in each of the plurality of sub-pixel regions;
forming a light transmitting layer on a surface of the light-emitting layer away from the substrate, a surface of the light transmitting layer away from the light-emitting layer being a curved surface recessed towards the light-emitting layer;
forming a pixel definition layer on a surface of the substrate, wherein the pixel definition layer defines the plurality of the sub-pixel regions which are spaced apart from each other;
forming a black matrix on a surface of the pixel definition layer away from the substrate,
wherein a curvature radius R of the curved surface of the light transmitting layer satisfies: $R \leq 2a \times (n-1)/(b \times h)$,
wherein an external incident light infinitely close to a center of the light transmitting layer is incident on an incident point of the substrate and then reflected by the substrate to form a reflect light, the reflect light coincides with a side of a cross section of the black matrix, wherein a is a distance between the incident point on the substrate and an edge of the pixel definition layer closest to the incident point, b is a spot diameter of the external incident light, n is a refractive index of the light transmitting layer, and h is a height of the pixel definition layer.

13. The method according to claim 12, wherein the pixel definition layer is made of an opaque material.

14. The method according to claim 13, wherein the black matrix is formed before forming the light transmitting layer.

15. The method according to claim 14, wherein before forming the black matrix, the method further comprising: forming a first inorganic layer on both the surface of the pixel definition layer away from the substrate and the surface of the light-emitting layer away from the substrate.

16. The method according to claim 12, wherein the light-emitting layer is formed by a photolithography process or an ink-jet printing process.

* * * * *